(12) United States Patent
Shen et al.

(10) Patent No.: US 9,443,771 B1
(45) Date of Patent: Sep. 13, 2016

(54) METHODS TO THIN DOWN RMG SIDEWALL LAYERS FOR SCALABILITY OF GATE-LAST PLANAR CMOS AND FINFET TECHNOLOGY

(71) Applicant: GLOBALFOUNDRIES Inc., Grand Cayman (KY)

(72) Inventors: Yanping Shen, Saratoga Springs, NY (US); Min-hwa Chi, Malta, NY (US); Ashish Kumar Jha, Saratoga Springs, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/935,676

(22) Filed: Nov. 9, 2015

(51) Int. Cl.
| H01L 21/8238 | (2006.01) |
| H01L 29/66 | (2006.01) |
| H01L 21/28 | (2006.01) |
| H01L 21/3215 | (2006.01) |
| H01L 21/3213 | (2006.01) |
| H01L 27/092 | (2006.01) |
| H01L 29/49 | (2006.01) |

(52) U.S. Cl.
CPC . *H01L 21/823828* (2013.01); *H01L 21/28088* (2013.01); *H01L 21/3215* (2013.01); *H01L 21/32134* (2013.01); *H01L 21/823821* (2013.01); *H01L 27/0924* (2013.01); *H01L 29/4966* (2013.01); *H01L 29/66545* (2013.01)

(58) Field of Classification Search
CPC ............... H01L 21/823828; H01L 21/28088; H01L 21/32134; H01L 21/3215; H01L 21/823821; H01L 27/092; H01L 27/0924; H01L 29/4966; H01L 29/66545
USPC .......................................... 257/369; 438/199
See application file for complete search history.

(56) References Cited

U.S. PATENT DOCUMENTS

| 8,936,988 B2 * | 1/2015 | Yin | H01L 21/02274 |
| | | | 438/300 |
| 9,209,186 B1 * | 12/2015 | Togo | H01L 27/0924 |

* cited by examiner

*Primary Examiner* — Tu-Tu To
(74) *Attorney, Agent, or Firm* — Ditthavong & Steiner, P.C.

(57) ABSTRACT

A method of removing RMG sidewall layers, and the resulting device are provided. Embodiments include forming a TiN layer in nFET and pFET RMG trenches; forming an a-Si layer over the TiN layer; implanting $O_2$ vertically in the a-Si layer; removing the a-Si layer and TiN layer from the side surfaces of the RMG trenches followed by the a-Si layer from the bottom surfaces; forming a TiN layer in the RMG trenches; forming a a-Si layer over the TiN layer; implanting $O_2$ vertically in the a-Si layer; removing the a-Si layer and TiN layer from the side surfaces of the RMG trenches, the a-Si layer from the bottom surfaces, and a remainder of the TiN layer from only the nFET RMG trench; forming a Ti layer in the RMG trenches; implanting Al or C in the Ti layer vertically and annealing; and filling the RMG trenches with Al or W.

17 Claims, 13 Drawing Sheets

METHODS TO THIN DOWN RMG SIDEWALL LAYERS FOR SCALABILITY OF GATE-LAST PLANAR CMOS AND FINFET TECHNOLOGY

TECHNICAL FIELD

The present disclosure relates to the manufacture of semiconductor devices with fin-type metal oxide semiconductor field effect transistors (FinFETs) and the front end of line (FEOL) process flow based on a high-k metal gate (HKMG) structure. The disclosure is particularly applicable to the 20 nanometer (nm) technology node and beyond.

BACKGROUND

As illustrated in FIG. 1, a known complementary metal-oxide semiconductors (CMOS) replacement metal gate (RMG) structure includes a number of conductive layers formed on top of a high-k dielectric layer 101 on side and bottom surfaces of an n-type FET (nFET) RMG trench 103 and a p-type FET (pFET) RMG trench 105 (each formed between a pair of spacers 107 in an interlayer dielectric (ILD) 109). The spacers 107 and ILD 109 are formed above the FinFETs' source/drain regions 111 and the STI region 113. For example, a titanium nitride (TiN) layer 115 is formed over the high-k dielectric layer 101. A tantalum nitride (TaN) layer 117 is then formed over the TiN layer 115. Next, a TiN layer 119 is formed over the TaN layer 117 in the pFET RMG trench 105. The work function (WF) for the pFET RMG trench 105 is determined by the TiN layer 119. A titanium aluminum (TiAl) or titanium carbon (TiC) layer (not shown for illustrative convenience) is then formed on the bottom surface of the both RMG trenches 103 and 105. The WF for the nFET RMG trench 103 is determined by the TiAl or TiC layer. Thereafter, a Ti wetting layer (not shown for illustrative convenience) is formed on the side and bottom surfaces of the RMG trenches 103 and 105 and then both are filled with either an aluminum (Al) or tungsten (W) layer 121. Consequently, the final spacing for the Al or W layer 113 is almost diminished, particularly with respect to the pFET RMG trench 105, creating a scaling limit for the 20 nm technology node and beyond. A known chamfering technique for improving the final spacing is complicated, e.g., it requires photo-resist (litho/masking) steps, proprietary sacrificial light absorbing material (SLAM) materials, e.g., DUO, partial etching steps, etc., all of which lead to high defect levels and low yields.

A need therefore exists for methodology enabling a simpler RMG sidewall chamfering process, and the resulting device.

SUMMARY

An aspect of the present disclosure is a process of forming RMG structures with thin sidewall layers.

Another aspect of the present disclosure is a RMG device including thin sidewall layers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first TiN layer on side and bottom surfaces of each of a nFET and a pFET RMG trench; forming a first a-Si layer over the first TiN layer; implanting a first $O_2$ vertically in the first a-Si layer; removing the first a-Si layer and first TiN layer from the side surfaces of the RMG trenches followed by the first a-Si layer from the bottom surfaces of the RMG trenches; forming a second TiN layer on the side and bottom surfaces of the RMG trenches; forming a second a-Si layer over the second TiN layer; implanting a second $O_2$ vertically in the second a-Si layer; removing sequentially the second a-Si layer and second TiN layer from the side surfaces of the RMG trenches, the second a-Si layer from the bottom surfaces of the RMG trenches, and a remainder of the second TiN layer from only the nFET RMG trench; forming a Ti layer on side and bottom surfaces of the RMG trenches; implanting Al or C in the Ti layer vertically and annealing; and filling the RMG trenches with Al or W.

Aspects of the present disclosure include forming a tantalum nitride (TaN) layer on side and bottom surfaces of the RMG trenches prior to forming the second TiN layer. Other aspects include forming the TaN layer to a thickness of 10 angstrom (Å) to 15 Å and the second TiN layer to a thickness of 2 nm to 6 nm. Further aspects include forming each of the first and second a-Si layers to a thickness of 2 nm to 5 nm. Another aspect includes performing each of the first and second $O_2$ implants at a dosage of 1e15 per centimeter squared ($cm^{-2}$) to 1e16 $cm^{-2}$ and at an energy of 5 kiloelectron volt (keV) to 10 keV. Additional aspects include removing the first a-Si layer by: wet stripping the first a-Si layer and the first TiN layer from the side surfaces of the RMG trenches; annealing the RMG trenches; performing a wet dilute hydrofluoric acid (DHF) dip; and stripping the first a-Si layer from the bottom surfaces of the RMG trenches. Other aspects include removing the second a-Si layer by: wet stripping the second a-Si layer and the second TiN layer from the side surfaces of the RMG trenches; performing a wet DHF dip; and wet stripping a remainder of the second a-Si layer. Further aspects include forming the Ti layer to a thickness of 6 nm to 12 nm. Another aspect includes implanting the Al or C in the Ti layer at a dose of 1E15 to 1E16 $cm^{-2}$. Additional aspects include the TiAl or TiC layers being formed to a thickness of 60 Å to 120 Å by the annealing.

Another aspect of the present disclosure is a device including: a nFET RMG trench formed in an ILD and having a high-k dielectric layer and a TaN layer on sidewalls and on a bottom surface of the nFET RMG trench; a pFET RMG trench formed in the ILD laterally separated from the nFET RMG trench and having a high-k dielectric layer and a TaN layer on sidewalls and on a bottom surface of the pFET RMG trench; an intermix layer over the TaN layer on the sidewalls of the RMG trenches; a pFET WF (pWF) material formed on a bottom surface of the pFET RMG trench; an nFET WF (nWF) material formed on a bottom surface of the nFET RMG trench and over the pWF material in the pFET RMG trench; and a W or Al layer filling a remainder of the RMG trenches.

Aspects of the device include the intermix layer being formed of Ti, Ta, and Al or W. Other aspects include the nWF material being formed of a layer of TiAl or TiC and the pWF material being formed of a layer of TiN.

A further aspect of the present disclosure is a method including: forming a first TiN layer on side and bottom surfaces of each of a nFET and a pFET RMG trench; forming a first a-Si layer to a thickness of 2 nm to 5 nm over the first TiN layer; implanting a first $O_2$ vertically in the first a-Si layer at a dosage of 1e15 $cm^{-2}$ to 1e16 $cm^{-2}$ and at an energy of 5 keV to 10 keV; removing the first a-Si layer and first TiN layer from the side surfaces of the RMG trenches followed by the first a-Si layer from the bottom surfaces of the RMG trenches; forming a second TiN layer to a thickness 2 nm to 6 nm on the side and bottom surfaces of the RMG trenches forming a second a-Si layer to a thickness of 2 nm to 5 nm over the second TiN layer; implanting a second $O_2$ vertically in the second a-Si layer at a dosage of 1e15 $cm^{-2}$ to 1e16 $cm^{-2}$ and at an energy of 5 keV to 10 keV; removing sequentially the second a-Si layer and second TiN layer from the side surfaces of the RMG trenches, the second a-Si layer from the bottom surfaces of the RMG trenches, and a remainder of the second TiN layer from only the nFET RMG trench; forming a Ti layer on side and bottom surfaces of the RMG trenches; implanting Al or C in the Ti layer vertically and annealing; and filling the RMG trenches with Al or W.

Aspects of the present disclosure include forming a TaN layer on side and bottom surfaces of the RMG trenches prior to forming the second TiN layer. Other aspects include forming the TaN layer to a thickness of 10 Å to 15 Å. Further aspects include removing the first a-Si layer by: wet stripping the first a-Si layer and the first TiN layer from the side surfaces of the RMG trenches; annealing the RMG trenches; performing a wet DHF dip; and stripping the first a-Si layer from the bottom surfaces of the RMG trenches. Another aspect includes removing the second a-Si layer by: wet stripping the second a-Si layer and the second TiN layer from the side surfaces of the RMG trenches; performing a wet DHF dip; and wet stripping a remainder of the second a-Si layer. Additional aspects include forming the Ti layer to a thickness of 6 nm to 12 nm. Other aspects include TiAl or TiC layers being formed to a thickness of 60 Å to 120 Å by the annealing.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
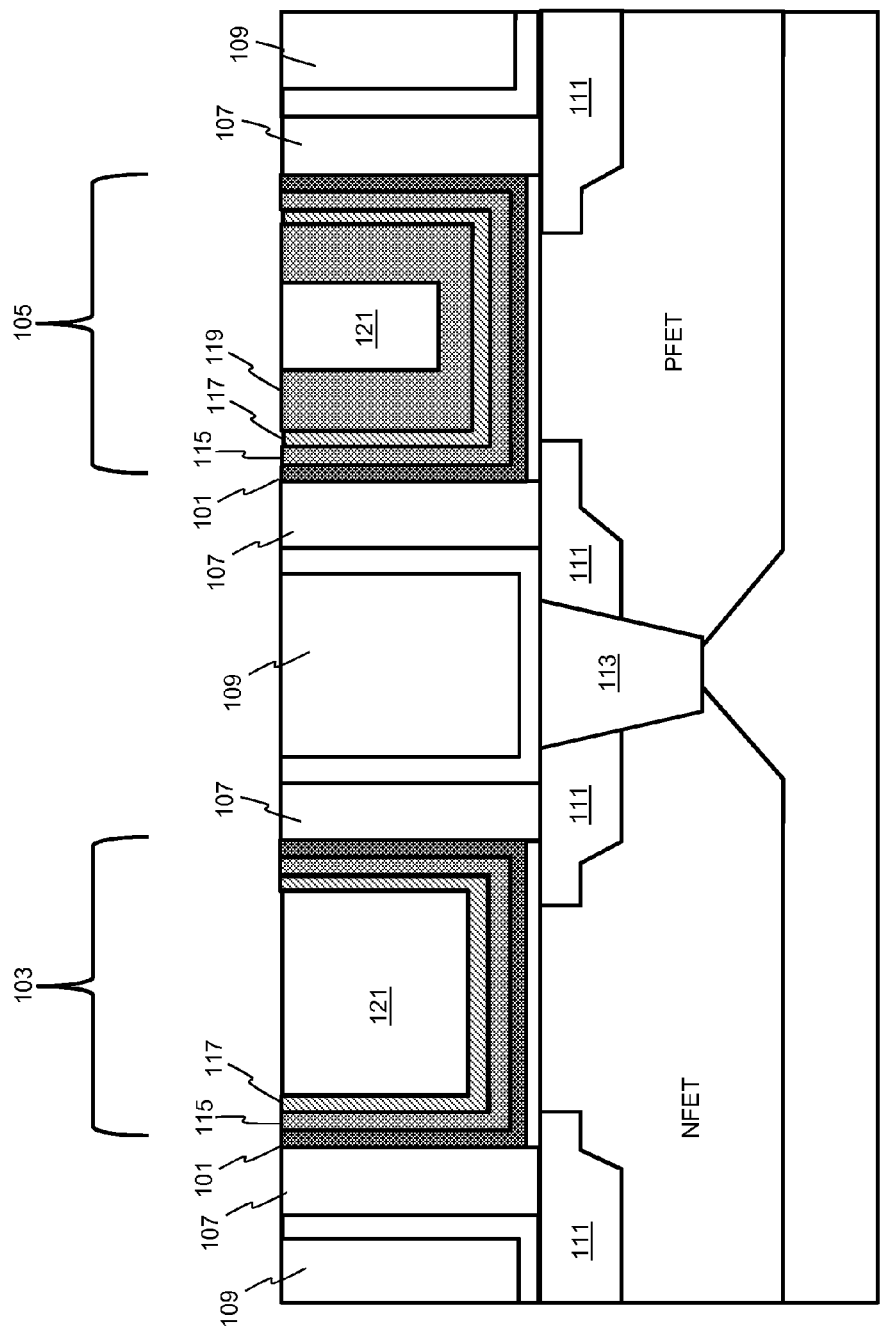
FIG. 1 schematically illustrates a background nFET and pFET RMG device.
Figure 2:
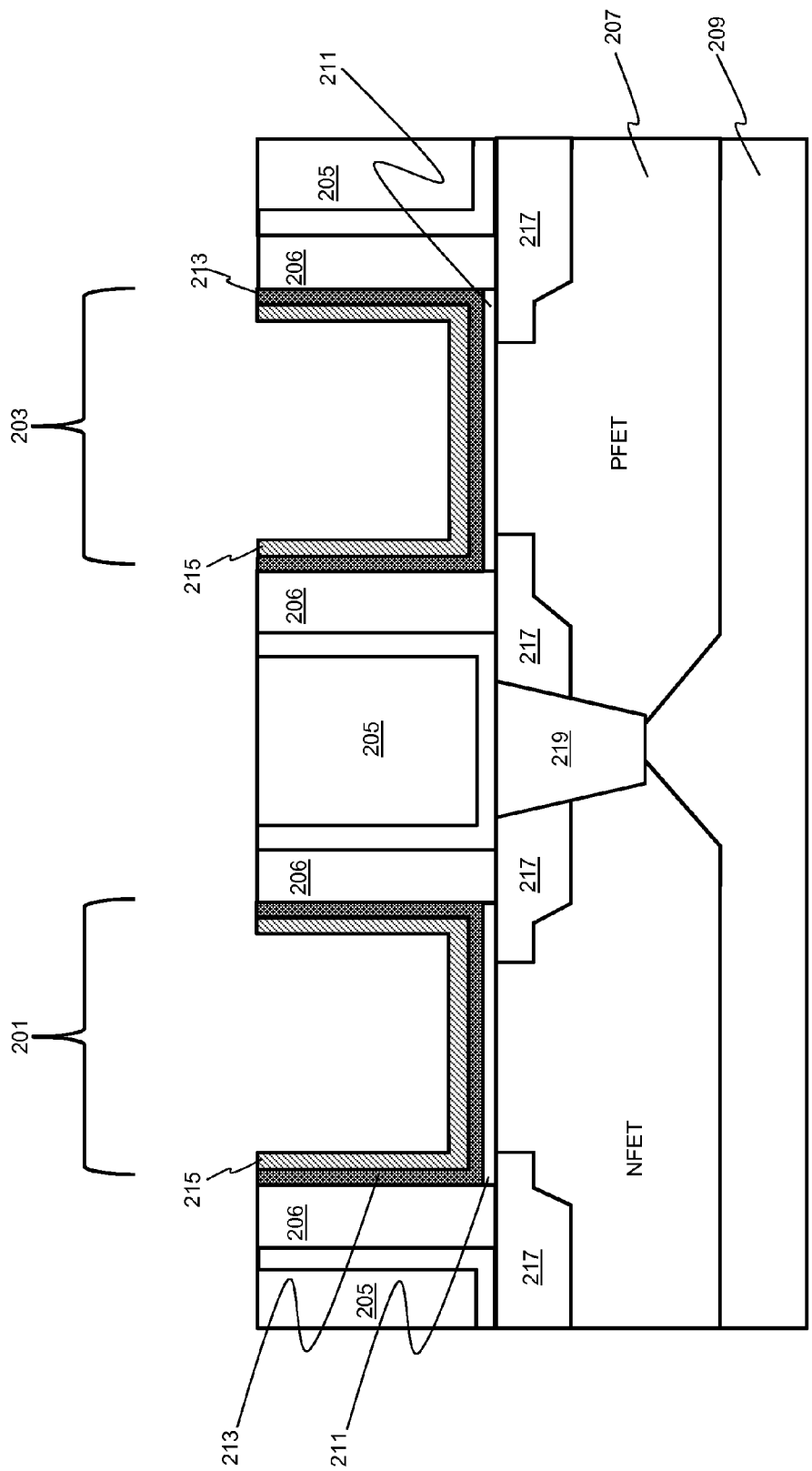
FIGS. 2 through 13 schematically illustrate a RMG sidewall chamfering process and RMG process flow for both an nFET and a pFET, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of diminished spacing for RMG metal gap-fill limiting scalability for the 20 nm node and beyond and a complicated sidewall chamfering process attendant upon forming gate-last planar CMOS and FinFET structures.

Methodology in accordance with embodiments of the present disclosure includes forming a TiN layer on side and bottom surfaces of each of an nFET and a pFET RMG trench. An a-Si layer is formed over the TiN layer, and first $O_2$ is vertically implanted in the a-Si layer. The first a-Si layer and first TiN layer are removed from the side surfaces of the RMG trenches. Subsequently, the a-Si layer is also removed from the bottom surfaces of the RMG trenches. A second TiN layer is formed on the side and bottom surfaces of the RMG trenches followed by a second a-Si layer. $O_2$ is again implanted vertically, but this time in the second a-Si layer. The second a-Si layer and second TiN layer are removed from the side surfaces of the RMG trenches, the second a-Si layer is removed from the bottom surfaces of the RMG trenches, and a remainder of the second TiN layer is removed from only the nFET RMG trench. A Ti layer is formed on side and bottom surfaces of the RMG trenches. Al or C is implanted in the Ti layer vertically and annealed. The RMG trenches are filled with Al or W.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2 through 12 (cross section views) schematically illustrate a RMG sidewall chamfering process and RMG process flow for both an nFET and a pFET, in accordance with an exemplary embodiment. Adverting to FIG. 2, an nFET RMG trench 201 and a pFET RMG trench 203 are formed in an ILD 205 (each between a pair of spacers 206) over and perpendicular to the Si fin 207, above a silicon substrate 209. After the RMG trenches 201 and 203 are opened, an interfacial layer (IL) 211, e.g., an oxide layer, is deposited on the bottom surface, and a high-k dielectric layer 213 and a TiN capping layer 215 are sequentially deposited, e.g., by atomic layer deposition (ALD), on side and bottom surfaces in the RMG trenches 201 and 203. The TiN layer 215 may be formed, for example, to a thickness of 15 Å for capping the high-k dielectric layer 213. Note that the FinFETs' source/drain regions 217 and a STI region 219 have been formed previously by conventional methods.

Figure 3:
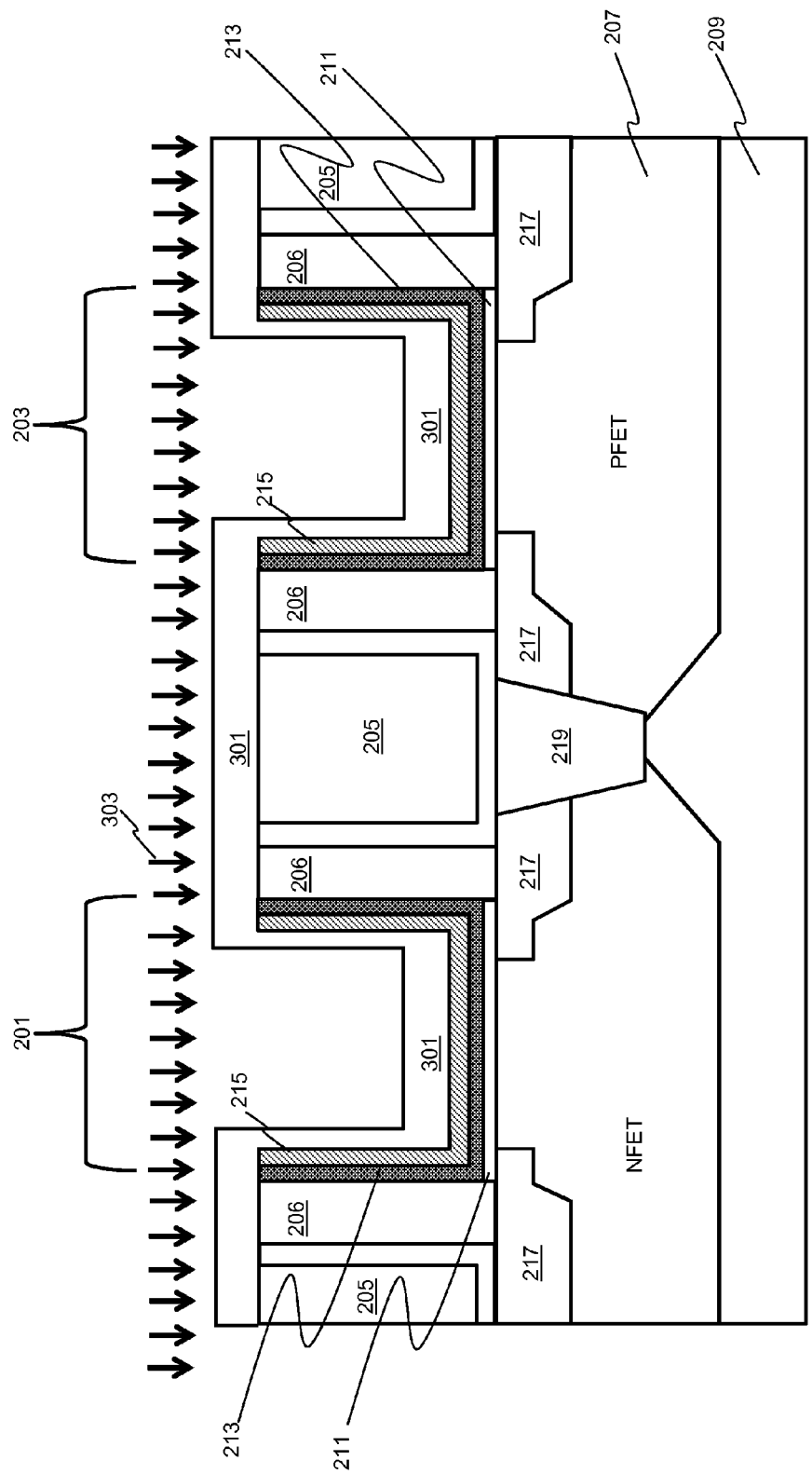

Next, a sacrificial a-Si layer 301 is formed over the TiN layer 215, as depicted in FIG. 3. The a-Si layer 301 may be formed, for example, to a thickness of 2 nm to 5 nm. The a-Si layer 301 may be formed, for example, by low pressure chemical vapor deposition (LPCVD) or plasma enhanced chemical vapor deposition (PECVD) at a low temperature, e.g., 500-600° C., using silicon tetrachloride ($SiCl_4$) or silicon chloride hydride ($SiCl_2H_2$). $O_2$ is then blanket implanted concurrently in the RMG trenches 201 and 203 vertically (referred to as a 0° implant angle) as shown by the arrows 303. The O₂ may be implanted, for example, at a dosage of 1e15 cm⁻² to 1e16 cm⁻² and at an energy of 5 keV to 10 keV.

Figure 4:
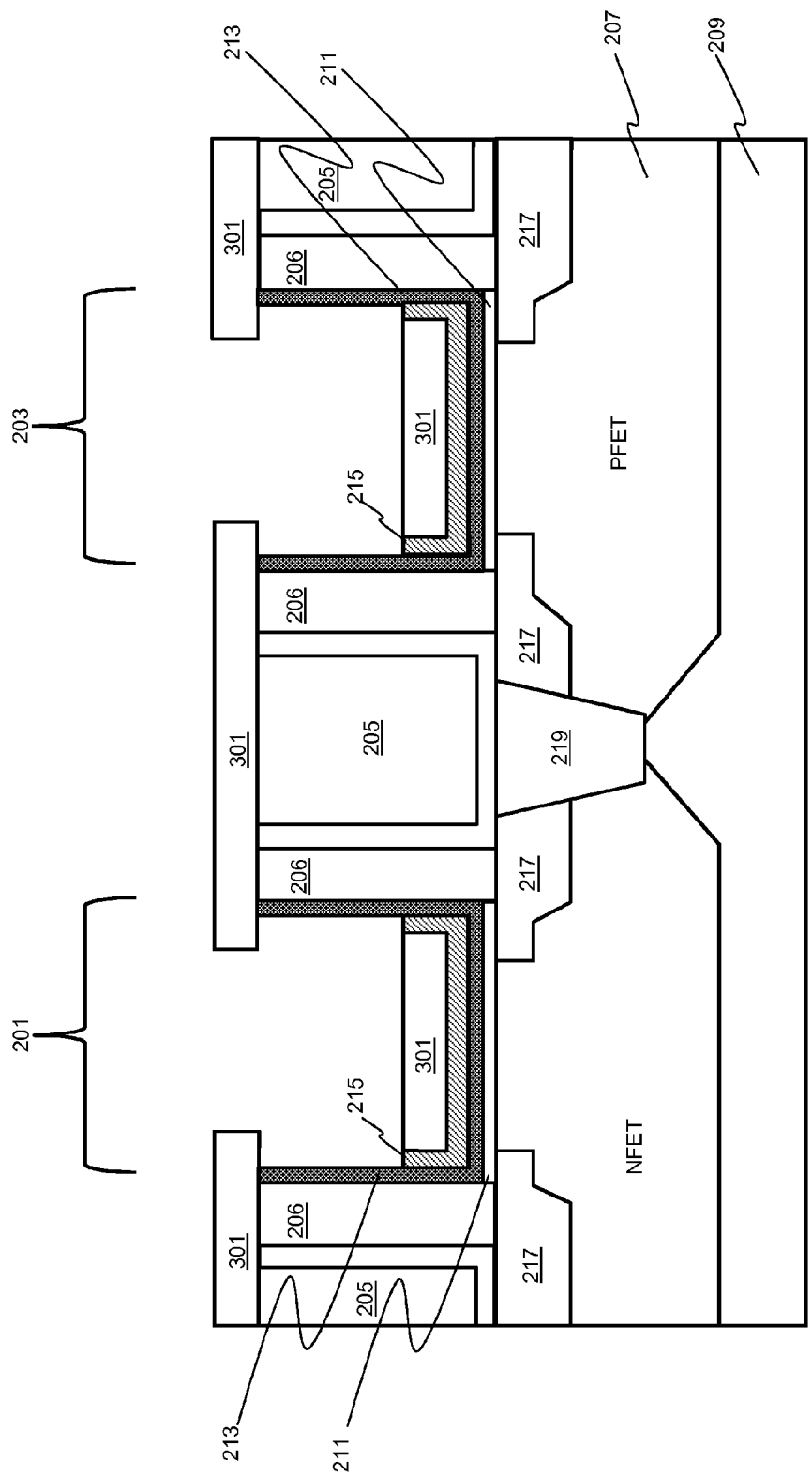

Adverting to FIG. 4, the a-Si layer 301 and a portion of the TiN layer 215 are removed from the side surfaces of the RMG trenches 201 and 203. The a-Si layer 301 and the TiN layer 215 may be removed, for example, by wet stripping. For instance, the a-Si layer 301 may be wet stripped by ammonium hydroxide (NH₄OH) or tetramethylammonium hydroxide (TMAH), and the TiN layer 215 may be wet stripped by hydrogen peroxide (H₂0₂) or ammonium hydroxide and hydrogen peroxide (SC1). The RMG trenches 201 and 203 are then annealed for the purpose of improving the reliability of the high-k dielectric layer 213.

Figure 5:
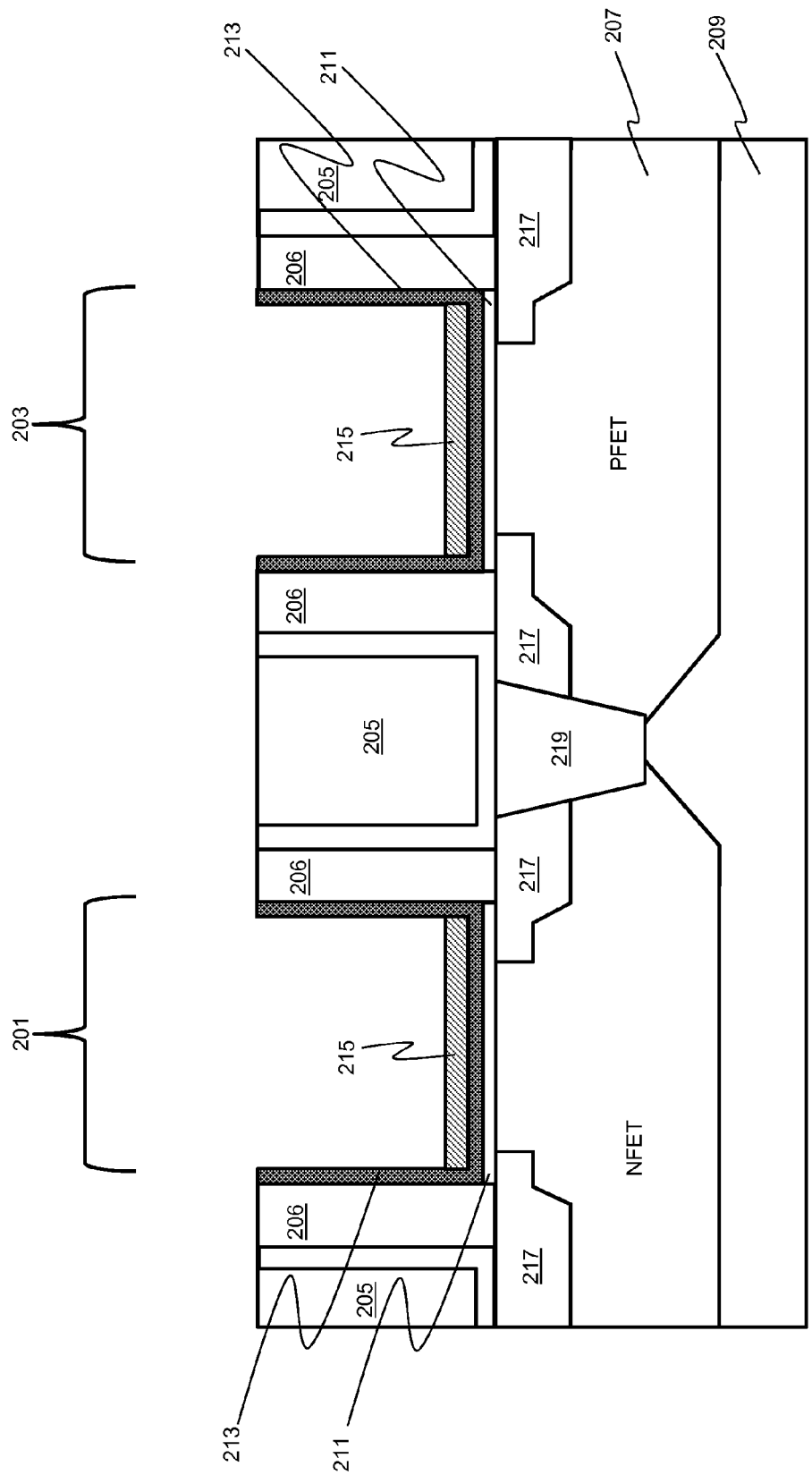
Figure 6:
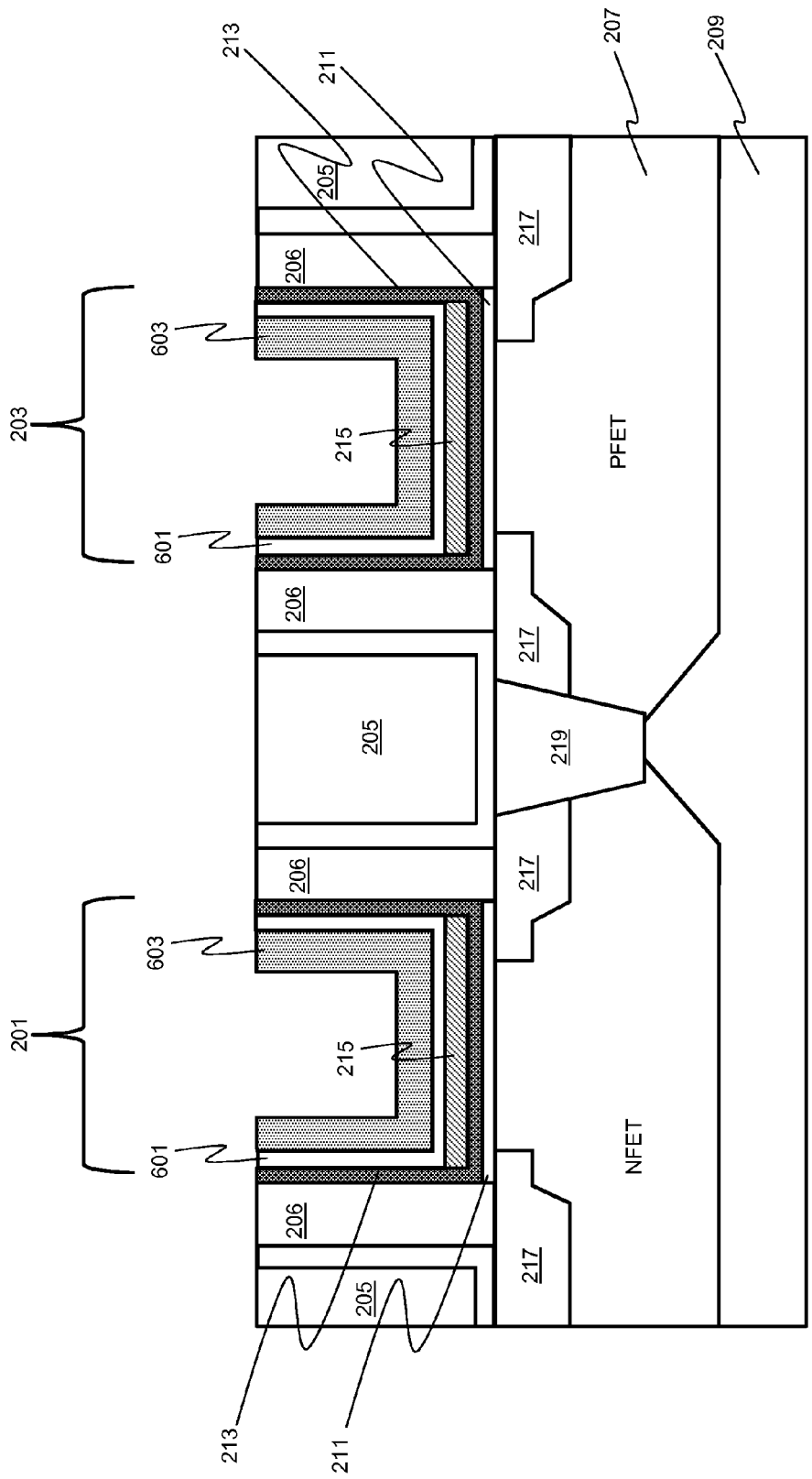

A wet DHF dip is then performed, and the remainder of the a-Si layer 301 is stripped, e.g., from the bottom surfaces of the RMG trenches 201 and 203, as depicted in FIG. 5. Adverting to FIG. 6, a TaN layer 601 is formed on the side and bottom surfaces of the RMG trenches 201 and 203 followed by a TiN layer 603 being formed. The TaN layer 601 may be formed, for example, to a thickness of 10 Å to 15 Å by ALD. The TiN layer 603 may be formed, for example, to a thickness of 2 nm to 6 nm by chemical vapor deposition (CVD) or ALD.

Figure 7:
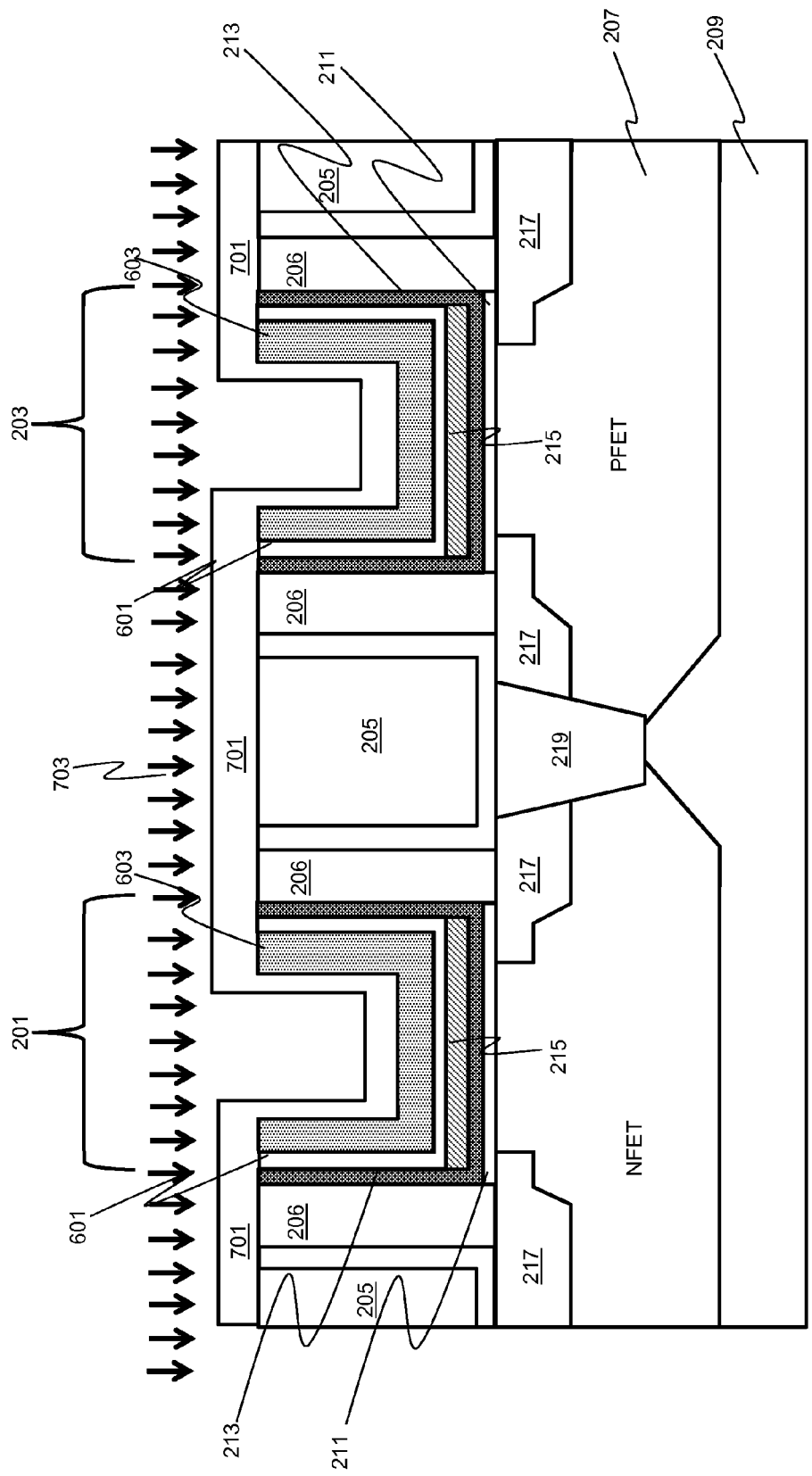

Adverting to FIG. 7, similar to FIG. 3, an a-Si layer 701 is formed over the TiN layer 603. Similar to the a-Si layer 301, the a-Si layer 701 may be formed, for example, to a thickness of 2 nm to 5 nm, by LPCVD or PECVD at a low temperature such as 500-600° C., using $SiCl_4$ or $SiCl_2H_2$. O₂ is again blanket implanted concurrently in the RMG trenches 201 and 203 vertically, i.e., at a 0° implant angle, as shown by the arrows 703. The O₂ may be implanted, for example, at a dosage of 1e15 cm⁻² to 1e16 cm⁻² and at an energy of 5 keV to 10 keV.

Figure 8:
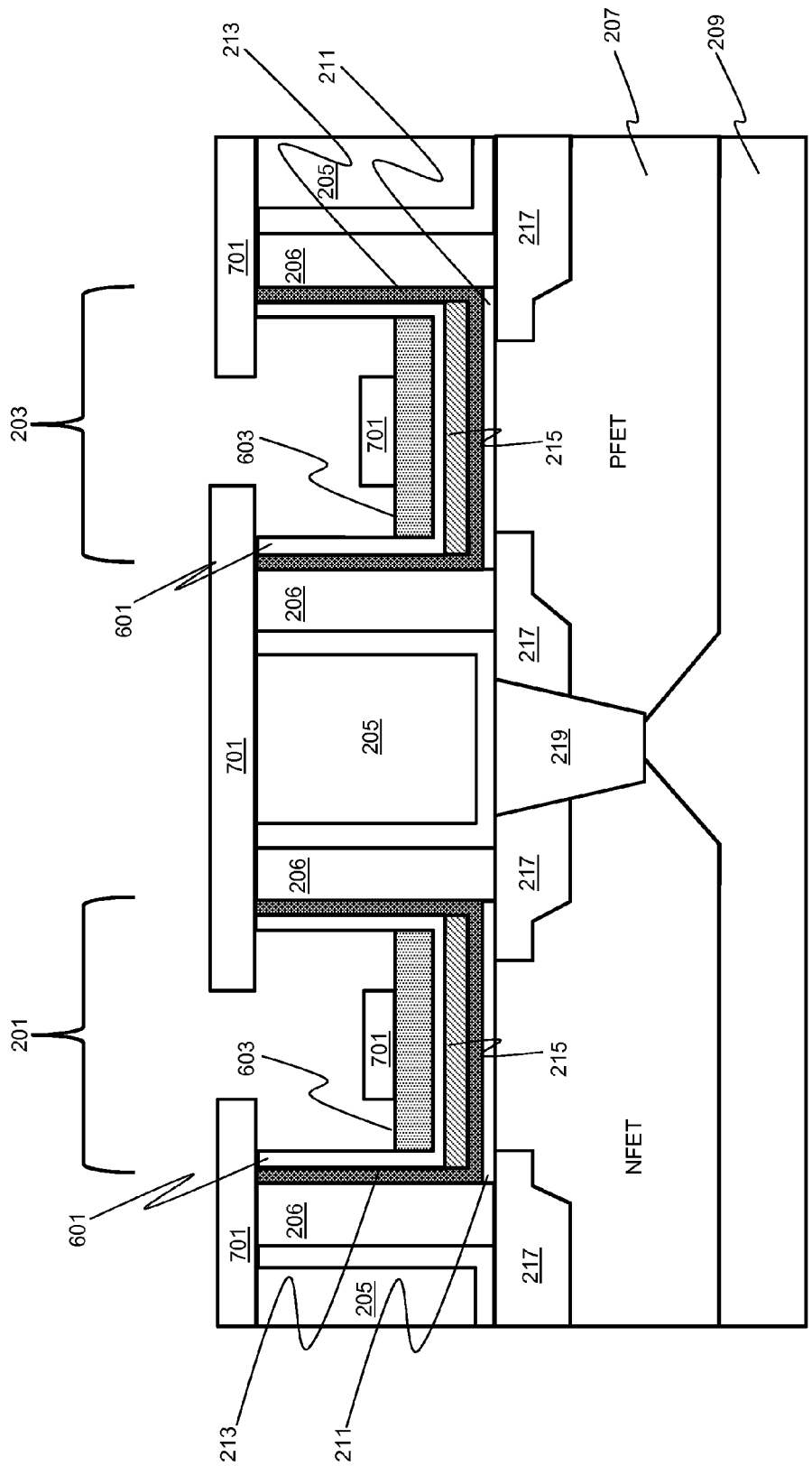
Figure 9:
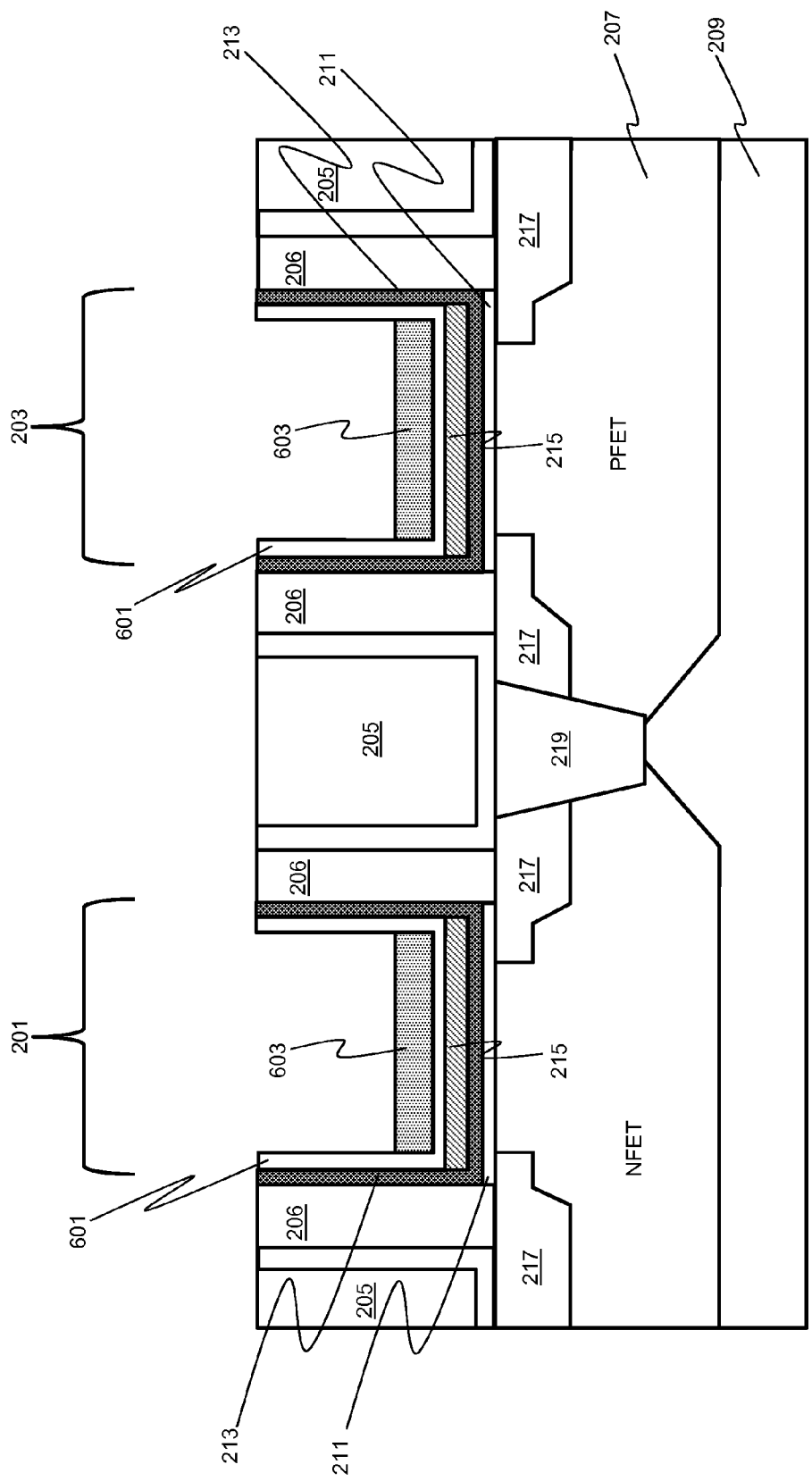

Next, the a-Si layer 701 and the TiN layer 603 are removed from the side surfaces of the RMG trenches 201 and 203, as depicted in FIG. 8. The a-Si layer 701 and the TiN layer 603 may be removed, for example, by wet stripping. For instance, the a-Si layer 701 may be wet stripped using NH₄OH or TMAH, and the TiN layer 603 may be wet stripped using H₂0₂ or SC1. Adverting to FIG. 9, a wet DHF dip is again performed, and the remainder of the a-Si layer 701 is stripped, e.g., from the bottom surfaces of the RMG trenches 201 and 203.

Figure 10:
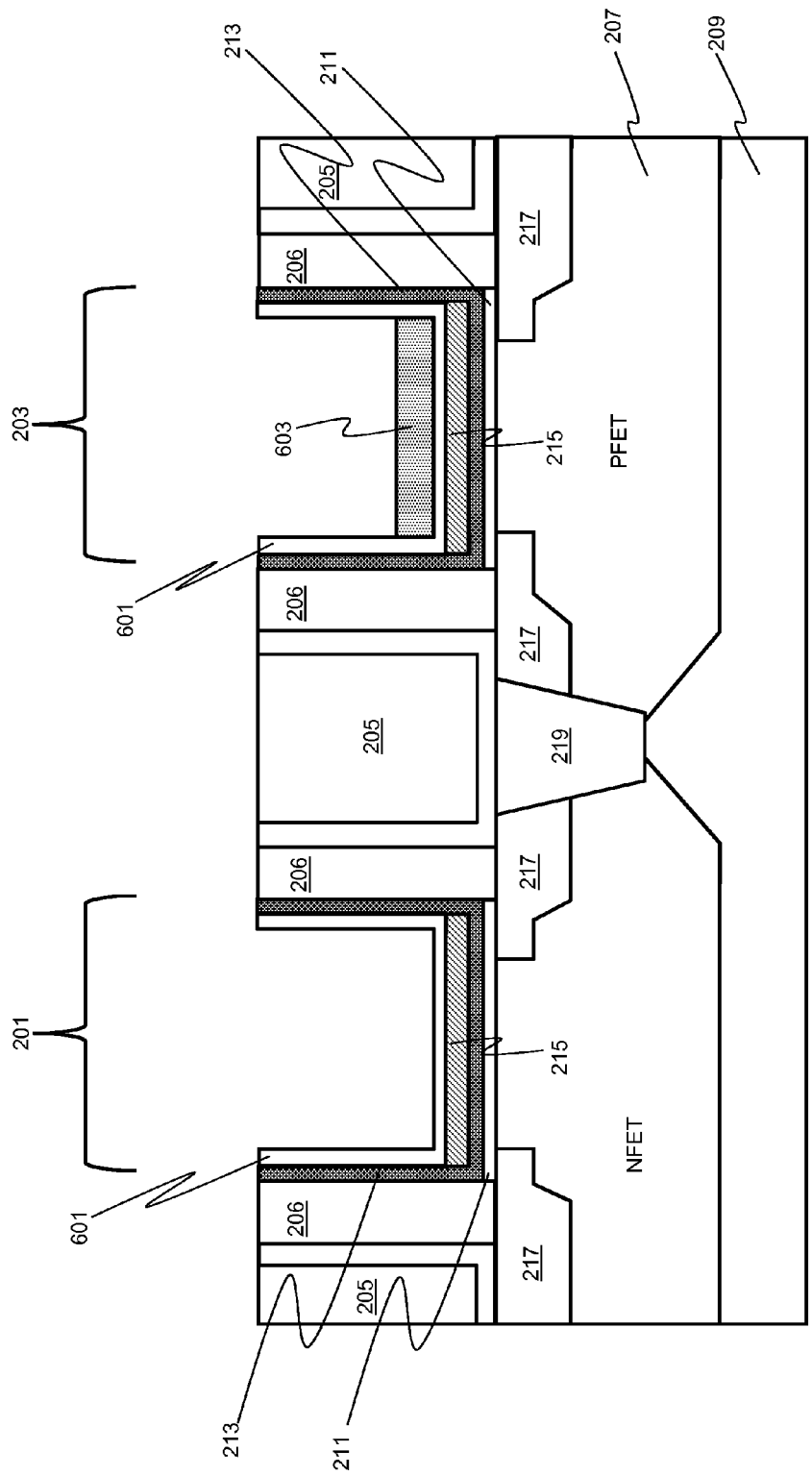
Figure 11:
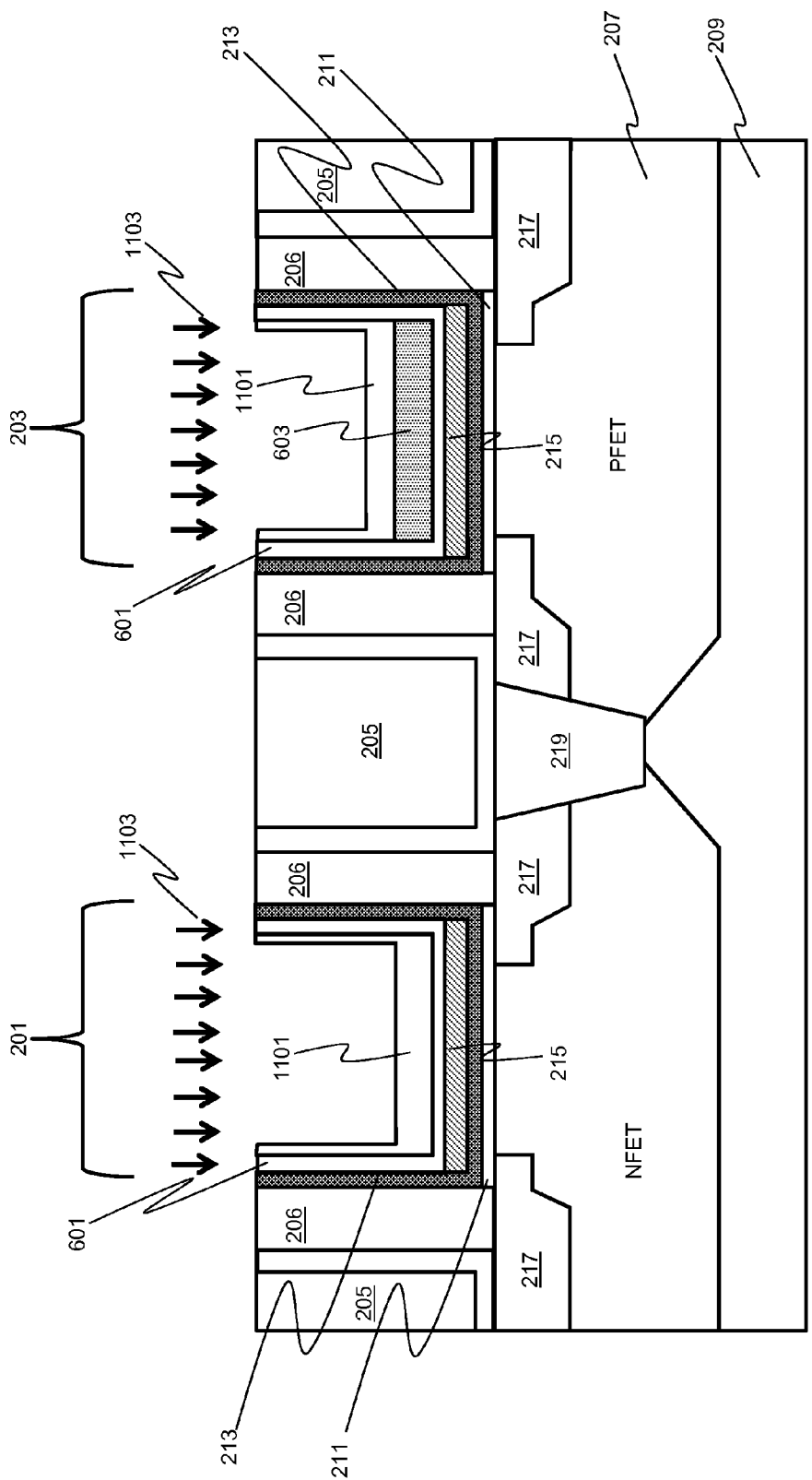

Adverting to FIG. 10, after photolithography (PG) patterning (not shown for illustrative convenience) to expose the nFET trench 201, the TiN layer 603 is removed from the nFET RMG trench 201. Next, a Ti layer 1101 is formed on the side and bottom surfaces of the RMG trenches 201 and 203, e.g., over the TaN layer 601 in the nFET RMG trench 201 and over the TaN layer 601 and TiN layer 603 in the pFET RMG trench 203, as depicted in FIG. 11. The Ti layer 1101 may serve as a wetting layer for subsequent Al or W deposition. The Ti layer 1101 may be formed, for example, to a thickness of 6 nm to 12 nm by CVD. The Ti layer 1101 is then implanted with either Al or C vertically at a 0° implant angle as shown by the arrows 1103. The Al or C may be blanket implanted with a dose of $1\times10^{15}$ to $1\times10^{17}$ cm⁻² to achieve 7 to 50 atomic percent (at. %) in the resulting TiAl or TiC layers.

Figure 12:
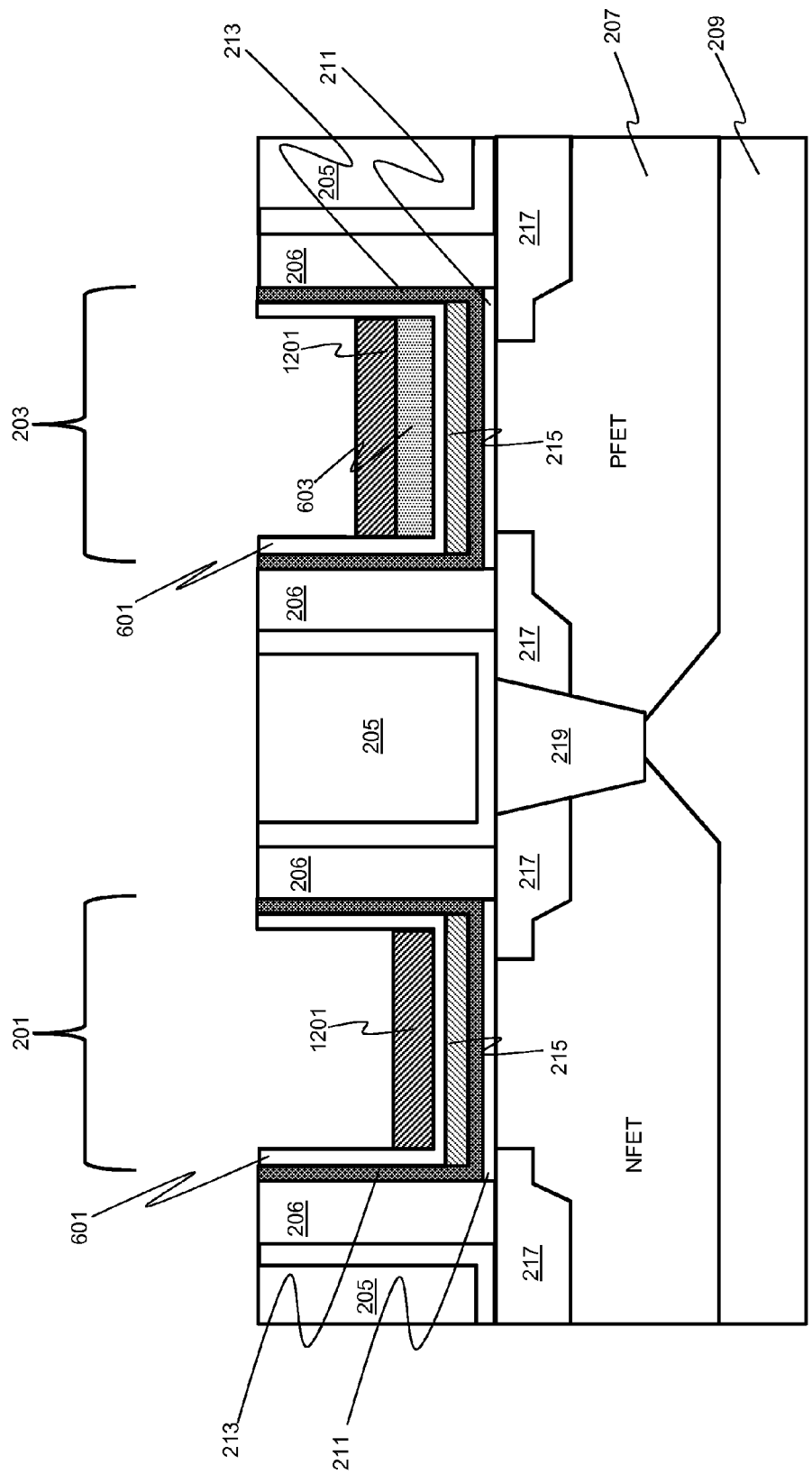

The Al or C implanted Ti layer 1101 is then annealed, for example, by RTA at a temperature of 400° C. to 900° C. depending on the dwell time or flash/laser anneal to form the TiAl or TiC layer 1201 on the bottom of the RMG trenches 201 and 203, as depicted in FIG. 12. The TiAl or TiC layer 1201 may be formed, for example, to a thickness of 60 Å to 120 Å. Note that the p-WF for the pFET is determined by the TiN layer 603 and is not affected by the TiAl or TiC layer 1201 (n-WF layer) on top of the TiN layer 603.

Figure 13:
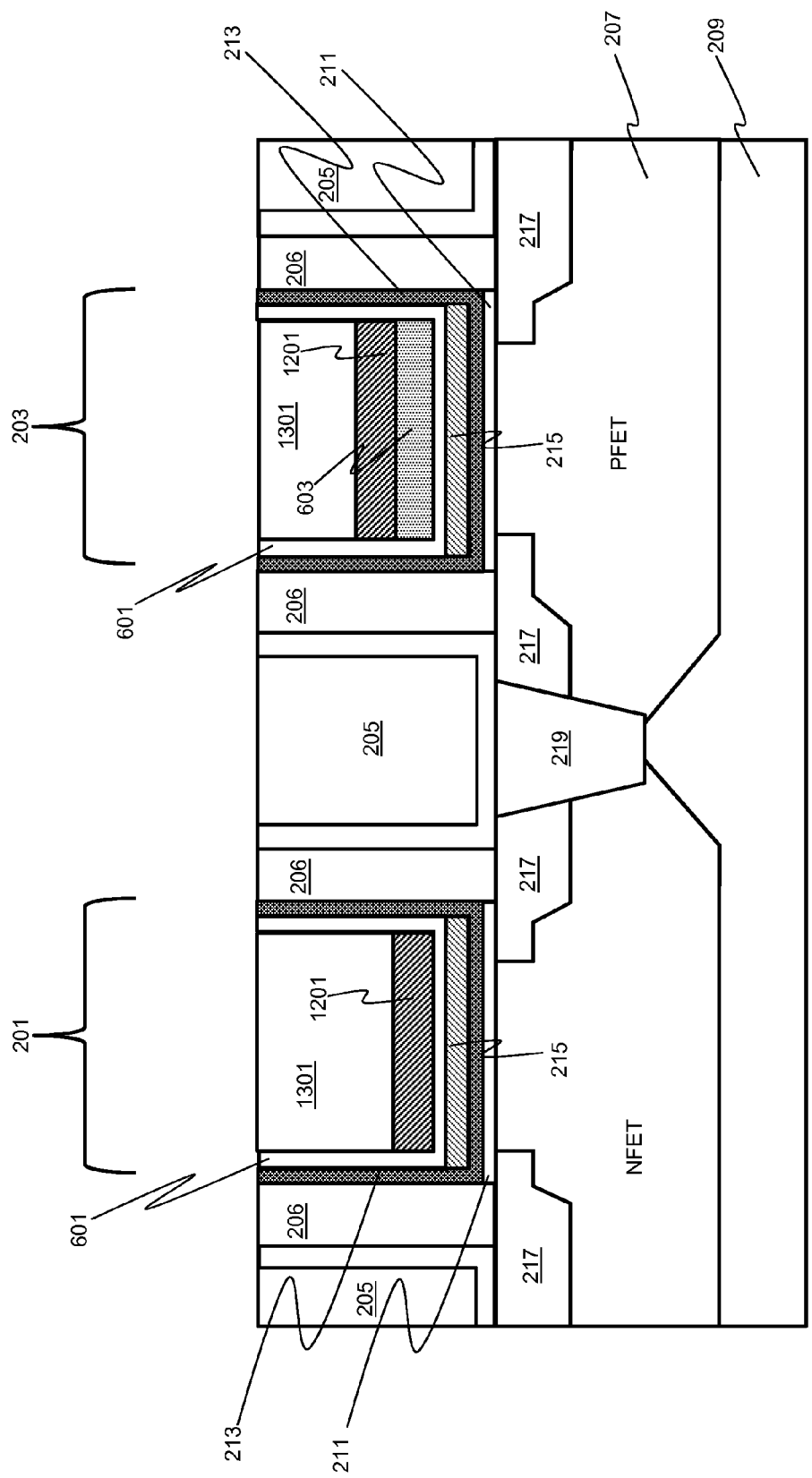

Adverting to FIG. 13, with no additional Ti wetting layer deposition, the RMG trenches 201 and 203 are filled with either an Al or W layer 1301. The RMG trenches 201 and 203 may be filled, for example, with 1000 Å to 2000 Å of Al or W by PVD or CVD, respectively. The filling of the RMG trenches 201 and 203 with either an Al or W layer 1301 forms an intermix layer (not shown for illustrative convenience) of Ti, Ta, and Al or W. The Al or W layer 1301 is then planarized, for example, by chemical mechanical polishing (CMP), to complete the RMG flow. Thereafter, conventional FinFET processing steps proceed. Note that the layers on the sidewalls of the RMG trenches 201 and 203 are thinner than they would be in a conventional scheme.

The embodiments of the present disclosure can achieve several technical effects including a RMG sidewall chamfering process without requiring photo-resist (litho/masking) steps, proprietary SLAM materials, partial etching steps, etc. In addition, the TiN cap and p-WF sidewall strip result in a wider opening for the subsequent Al or W gap-fill, i.e., resulting in better gap-fill margins, strong scalability, and lower RMG resistance. Further, the TiN cap sidewall strip can result in better nFET short channel control with more WF material at the corner areas. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first titanium nitride (TiN) layer on side and bottom surfaces of each of a n-type field effect transistor (nFET) and a p-type FET (pFET) replacement metal gate (RMG) trench;
   forming a first amorphous silicon (a-Si) layer over the first TiN layer;
   implanting a first oxygen gas (O₂) vertically in the first a-Si layer;
   removing the first a-Si layer and first TiN layer from the side surfaces of the RMG trenches followed by the first a-Si layer from the bottom surfaces of the RMG trenches;
   forming a second TiN layer on the side and bottom surfaces of the RMG trenches;
   forming a second a-Si layer over the second TiN layer;
   implanting a second O₂ vertically in the second a-Si layer;
   removing sequentially the second a-Si layer and second TiN layer from the side surfaces of the RMG trenches, the second a-Si layer from the bottom surfaces of the RMG trenches, and a remainder of the second TiN layer from only the nFET RMG trench;

forming a Ti layer on side and bottom surfaces of the RMG trenches;

implanting aluminum (Al) or carbon (C) in the Ti layer vertically and annealing; and filling the RMG trenches with Al or tungsten (W).

2. The method according to claim 1, further comprising forming a tantalum nitride (TaN) layer on side and bottom surfaces of the RMG trenches prior to forming the second TiN layer.

3. The method according to claim 2, further comprising forming the TaN layer to a thickness of 10 angstrom (Å) to 15 Å and the second TiN layer to a thickness of 2 nanometer (nm) to 6 nm.

4. The method according to claim 1, comprising forming each of the first and second a-Si layers to a thickness of 2 nm to 5 nm.

5. The method according to claim 1, comprising performing each of the first and second $O_2$ implants at a dosage of 1e15 per centimeter squared ($cm^{-2}$) to 1e16 $cm^{-2}$ and at an energy of 5 kiloelectron volt (keV) to 10 keV.

6. The method according to claim 1, comprising removing the first a-Si layer by:

wet stripping the first a-Si layer and the first TiN layer from the side surfaces of the RMG trenches;

annealing the RMG trenches;

performing a wet dilute hydrofluoric acid (DHF) dip; and stripping the first a-Si layer from the bottom surfaces of the RMG trenches.

7. The method according to claim 1, comprising removing the second a-Si layer by:

wet stripping the second a-Si layer and the second TiN layer from the side surfaces of the RMG trenches;

performing a wet DHF dip; and wet stripping a remainder of the second a-Si layer.

8. The method according to claim 1, comprising forming the Ti layer to a thickness of 6 nm to 12 nm.

9. The method according to claim 1, further comprising implanting the Al or C in the Ti layer at a dose of 1E15 to 1E16 $cm^{-2}$.

10. The method according to claim 9, wherein the titanium aluminum (TiAl) or titanium carbon (TiC) layers are formed to a thickness of 60 Å to 120 Å by the annealing.

11. A method comprising:

forming a first titanium nitride (TiN) layer on side and bottom surfaces of each of a n-type field effect transistor (nFET) and a p-type FET (pFET) replacement metal gate (RMG) trench;

forming a first amorphous silicon (a-Si) layer to a thickness of 2 nanometer (nm) to 5 nm over the first TiN layer;

implanting a first oxygen gas ($O_2$) vertically in the first a-Si layer at a dosage of 1e15 per centimeter squared ($cm^{-2}$) to 1e16 $cm^{-2}$ and at an energy of 5 kiloelectron volt (keV) to 10 keV;

removing the first a-Si layer and first TiN layer from the side surfaces of the RMG trenches followed by the first a-Si layer from the bottom surfaces of the RMG trenches;

forming a second TiN layer to a thickness 2 nm to 6 nm on the side and bottom surfaces of the RMG trenches;

forming a second a-Si layer to a thickness of 2 nm to 5 nm over the second TiN layer;

implanting a second $O_2$ vertically in the second a-Si layer at a dosage of 1e15 $cm^{-2}$ to 1e16 $cm^{-2}$ and at an energy of 5 keV to 10 keV;

removing sequentially the second a-Si layer and second TiN layer from the side surfaces of the RMG trenches, the second a-Si layer from the bottom surfaces of the RMG trenches, and a remainder of the second TiN layer from only the nFET RMG trench;

forming a Ti layer on side and bottom surfaces of the RMG trenches;

implanting aluminum (Al) or carbon (C) in the Ti layer vertically and annealing; and filling the RMG trenches with Al or tungsten (W).

12. The method according to claim 11, further comprising forming a tantalum nitride (TaN) layer on side and bottom surfaces of the RMG trenches prior to forming the second TiN layer.

13. The method according to claim 12, comprising forming the TaN layer to a thickness of 10 angstrom (Å) to 15 Å.

14. The method according to claim 11, comprising removing the first a-Si layer by:

wet stripping the first a-Si layer and the first TiN layer from the side surfaces of the RMG trenches;

annealing the RMG trenches;

performing a wet dilute hydrofluoric acid (DHF) dip; and stripping the first a-Si layer from the bottom surfaces of the RMG trenches.

15. The method according to claim 11, comprising removing the second a-Si layer by:

wet stripping the second a-Si layer and the second TiN layer form the side surfaces of the RMG trenches;

performing a wet DHF dip; and wet stripping a remainder of the second a-Si layer.

16. The method according to claim 11, comprising forming the Ti layer to a thickness of 6 nm to 12 nm.

17. The method according to claim 11, wherein TiAl or TiC layers are formed to a thickness of 60 Å to 120 Å by the annealing.

* * * * *